(12) United States Patent
Murakami et al.

(10) Patent No.: US 10,804,325 B2
(45) Date of Patent: Oct. 13, 2020

(54) SEMICONDUCTOR MEMORY DEVICE

(71) Applicant: TOSHIBA MEMORY CORPORATION, Minato-ku, Tokyo (JP)

(72) Inventors: Yosuke Murakami, Yokkaichi Mie (JP); Yusuke Arayashiki, Yokkaichi Mie (JP); Kazuhiko Yamamoto, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/129,249

(22) Filed: Sep. 12, 2018

(65) Prior Publication Data

US 2019/0296079 A1   Sep. 26, 2019

(30) Foreign Application Priority Data

Mar. 23, 2018  (JP) ................. 2018-055704

(51) Int. Cl.
*H01L 27/24*  (2006.01)
*H01L 45/00*  (2006.01)

(52) U.S. Cl.
CPC .......... *H01L 27/249* (2013.01); *H01L 45/144* (2013.01); *H01L 45/146* (2013.01); *H01L 45/148* (2013.01)

(58) Field of Classification Search
CPC ........... H01L 27/1163; H01L 27/11568; H01L 27/11578; H01L 27/1158; H01L 27/11582
See application file for complete search history.

(56) References Cited

U.S. PATENT DOCUMENTS

| 9,006,793 | B2 | 4/2015 | Wei et al. |
| 9,099,648 | B2 | 8/2015 | Yamato et al. |
| 9,595,567 | B2 | 3/2017 | Yamamoto |
| 9,653,565 | B2 * | 5/2017 | Jang ..................... H01L 29/495 |
| 2011/0298037 | A1 * | 12/2011 | Choe .................. H01L 27/11556 |
| | | | 257/324 |
| 2017/0263682 | A1 | 9/2017 | Komura et al. |

FOREIGN PATENT DOCUMENTS

| JP | 2013-197396 | 9/2013 |
| TW | 201803101 A | 1/2018 |

* cited by examiner

*Primary Examiner* — Allison Bernstein
(74) *Attorney, Agent, or Firm* — Foley & Lardner LLP

(57) ABSTRACT

According to one embodiment, a semiconductor memory device includes a substrate, a first signal line, a first conductive layer, a first storage layer and a first insulation layer. The first signal line extends in a first direction crossing the substrate. The first conductive layer extends in a second direction crossing the first direction and being parallel to the substrate, and has a first surface and a second surface that is away from the first signal line in a third direction crossing the first and second directions. The first storage layer is provided between the first signal line and the first conductive layer. The first insulation layer is provided between the second surface and the first storage layer.

15 Claims, 13 Drawing Sheets

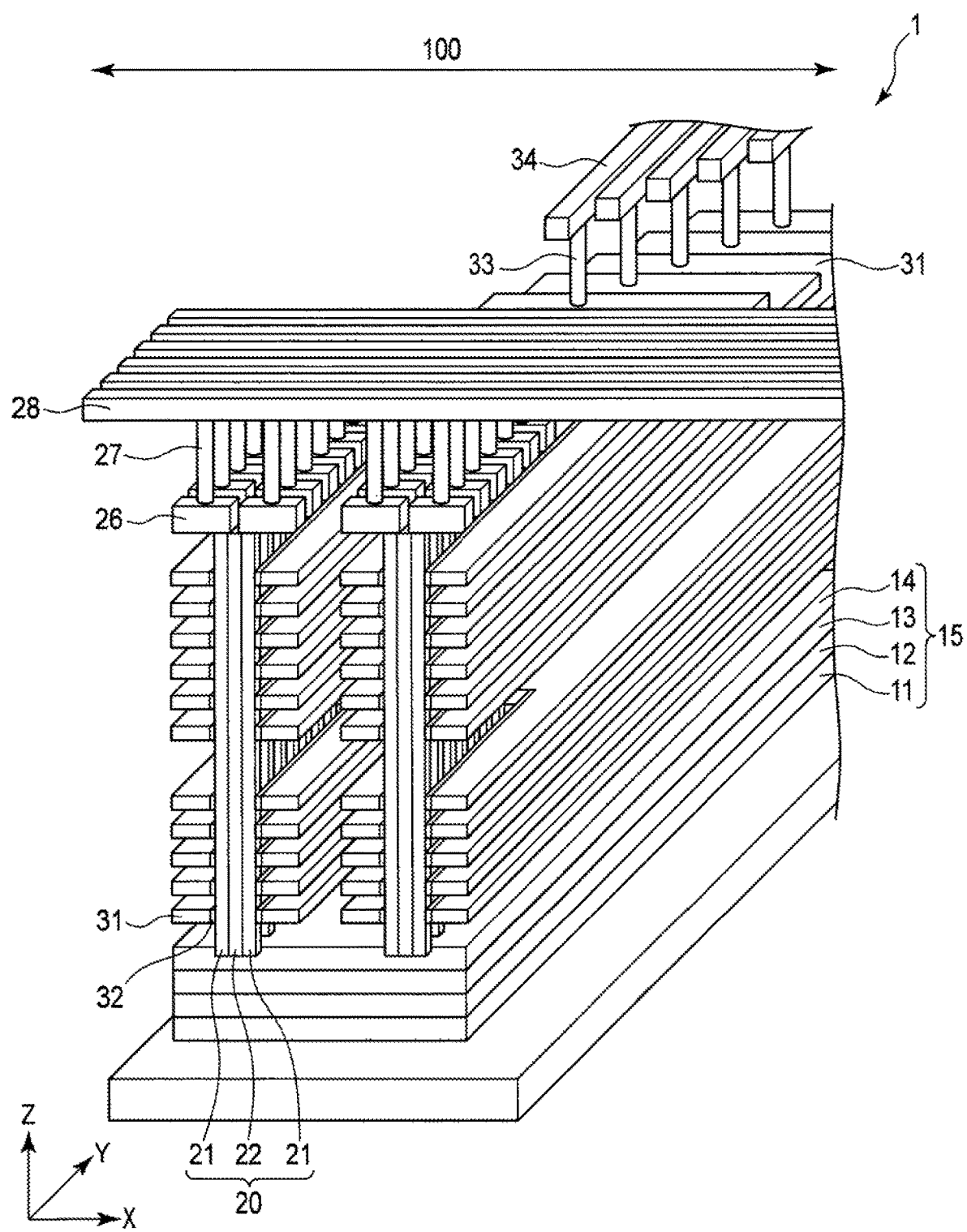
F I G. 1

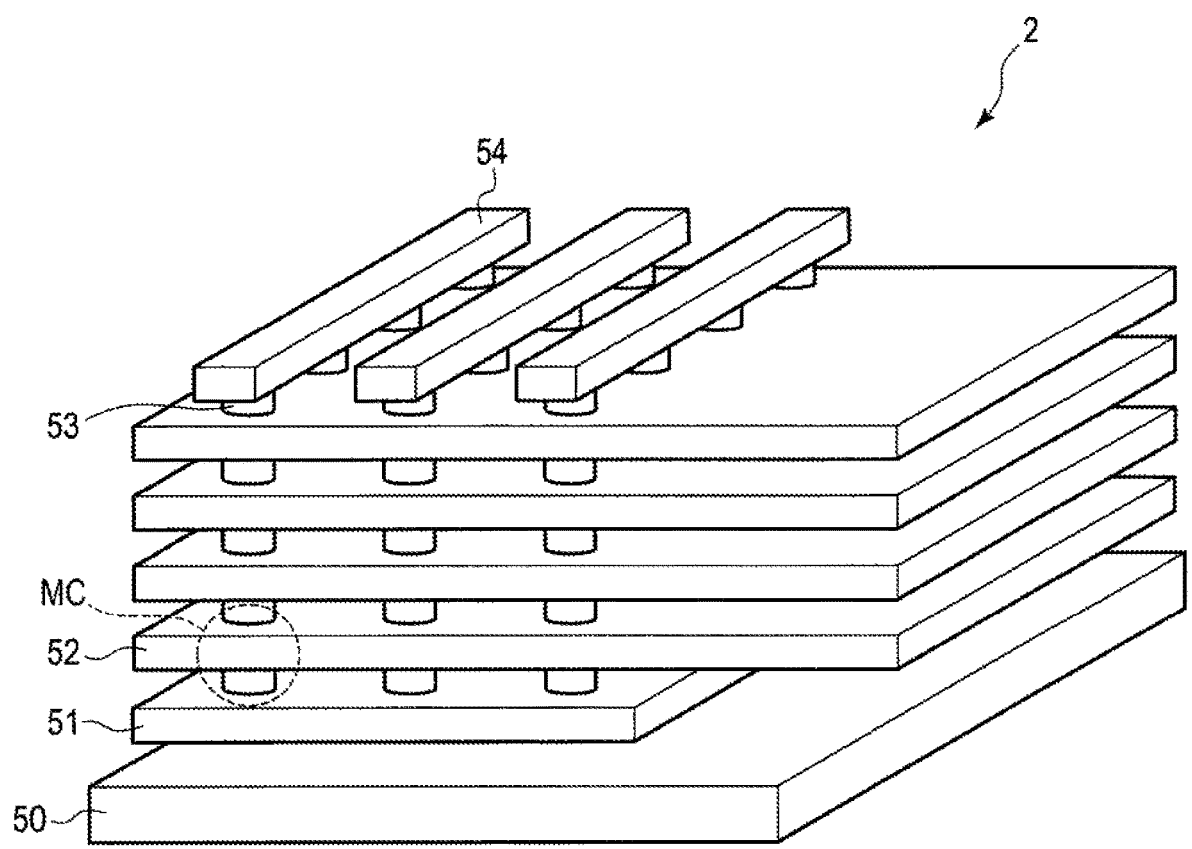
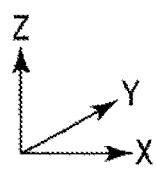
F I G. 3

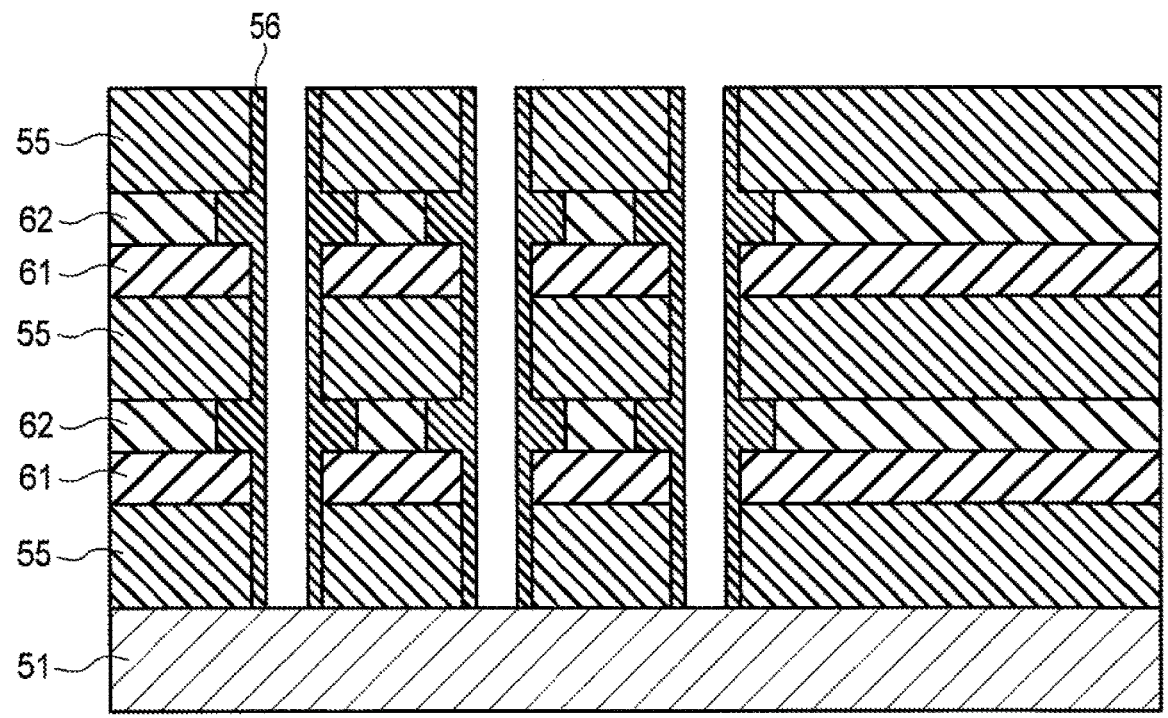
F I G. 12
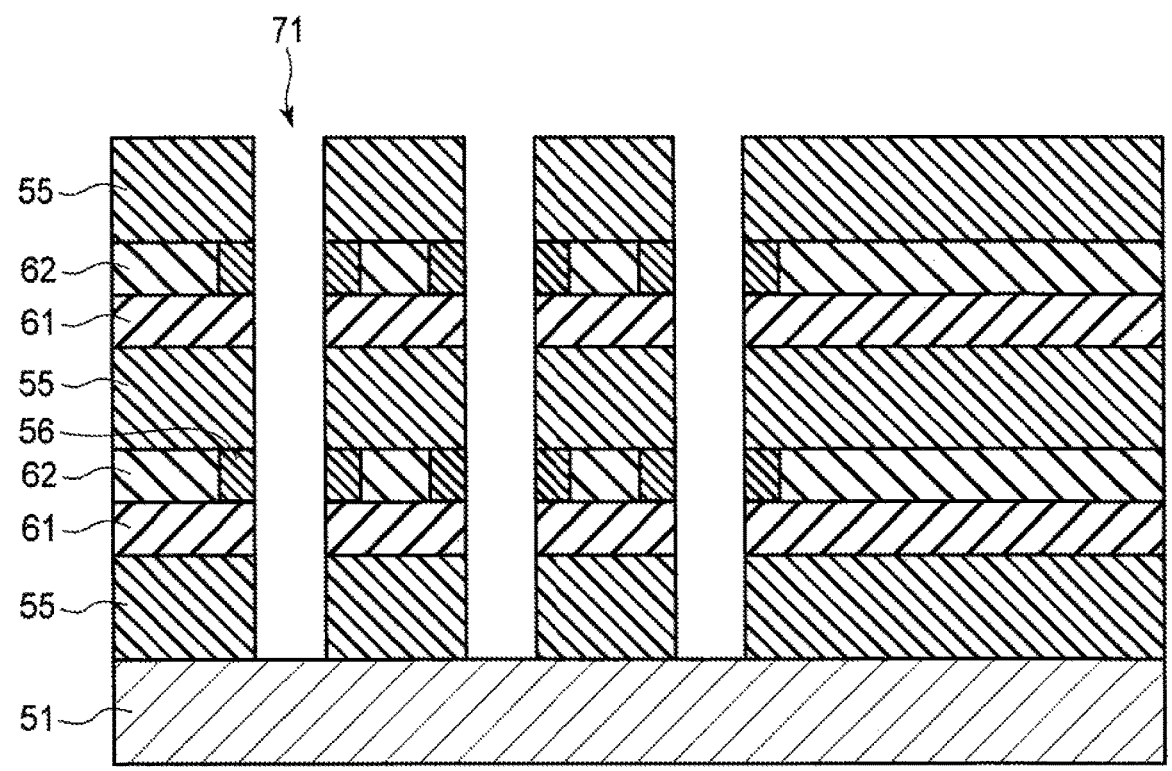
F I G. 13

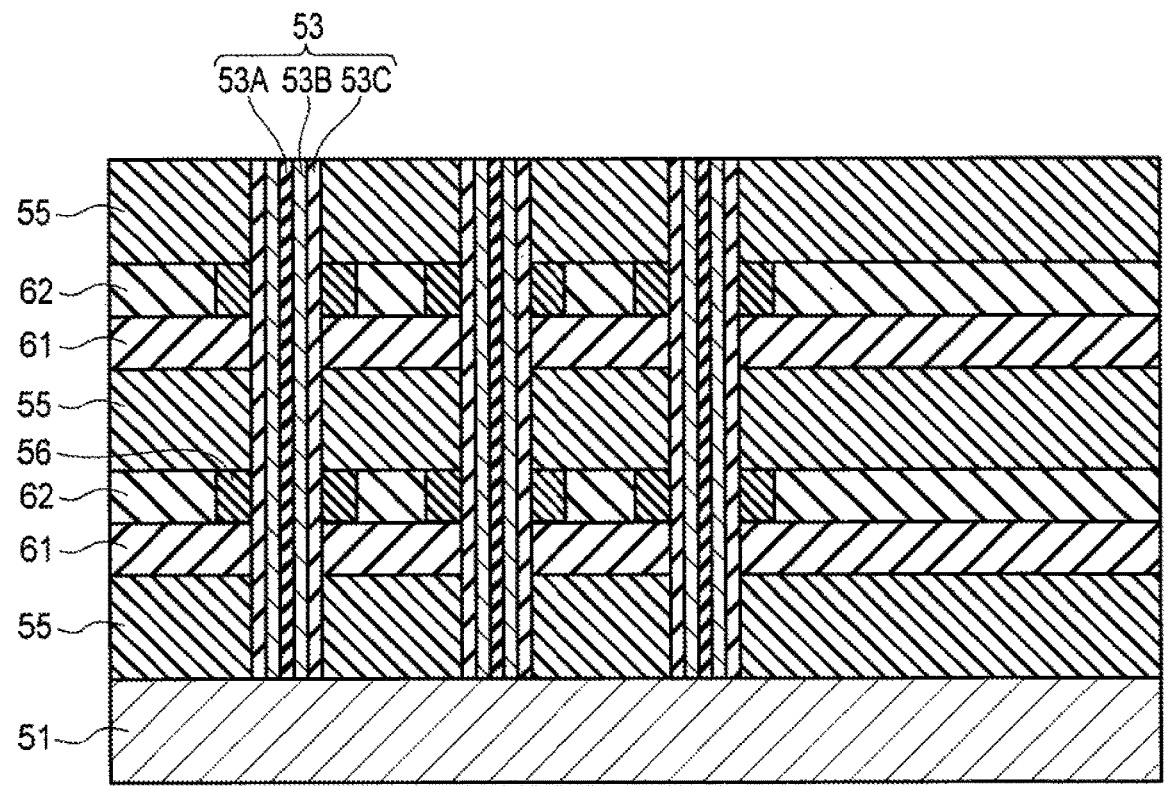
F I G. 14
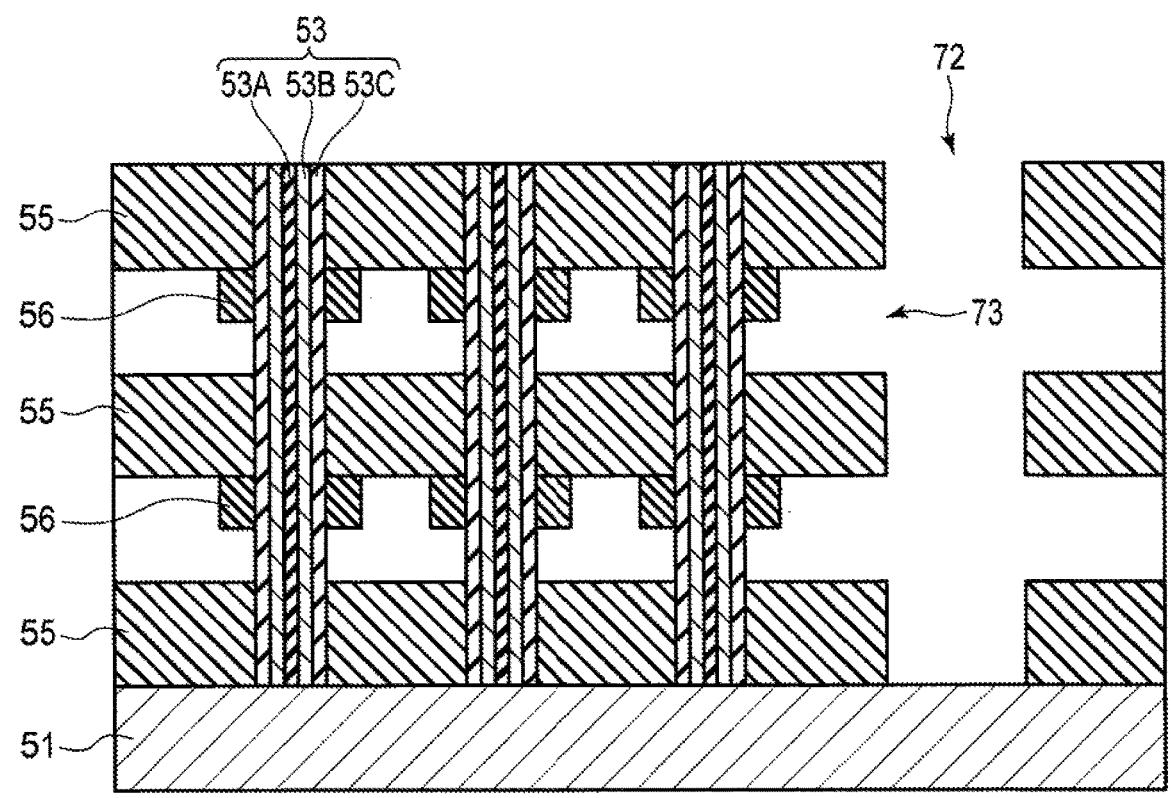
F I G. 15

SEMICONDUCTOR MEMORY DEVICE

CROSS-REFERENCE TO RELATED APPLICATIONS

This application is based upon and claims the benefit of priority from the Japanese Patent Application No. 2018-055704, filed Mar. 23, 2018, the entire contents of which are incorporated herein by reference.

FIELD

Embodiments described herein relate generally to a semiconductor memory device.

BACKGROUND

As a semiconductor memory device, an NAND memory device including a resistance change memory or memory cells has been known. Examples of the resistance change memory include a resistive random access memory (ReRAM). Memory cells of ReRAM each includes a resistance change layer whose resistance value is changed by application of a voltage. High-integration and cost reduction are expected by stacking ReRAM memory cells to form a three-dimensional structure.

BRIEF DESCRIPTION OF THE DRAWINGS

FIG. 1 is a perspective diagram showing the configuration of a semiconductor memory device according to a first embodiment.

FIG. 3 is a perspective diagram showing another configuration (first configuration) of the semiconductor memory device according to the first embodiment.

FIGS. 9-15 are cross-sectional diagrams showing a manufacturing method of a semiconductor memory device according to the first embodiment.

DETAILED DESCRIPTION

In general, according to one embodiment, a semiconductor memory device includes a substrate, a first signal line, a first conductive layer, a first storage layer and a first insulation layer. The first signal line extends in a first direction crossing the substrate. The first conductive layer extends in a second direction crossing the first direction and being parallel to the substrate, and has a first surface and a second surface that is away from the first signal line in a third direction crossing the first and second directions. The first storage layer is provided between the first signal line and the first conductive layer. The first insulation layer is provided between the second surface and the first storage layer.

Hereinafter, embodiments will be described with reference to drawings. In the following descriptions, structural elements having the same functions and the same configurations are provided with the same signs. The drawings are schematic or conceptual diagrams, and therefore, the sizes and the ratios, etc. in each of the drawings are not exactly the same as those actually used in practice. Each of the embodiments described herein is for exemplifying a device or a method for embodying the technical ideas of the embodiment, and materials, shapes, structures, and arrangements, etc. of structural components are not specified to those described below.

1. First Embodiment

A semiconductor memory device according to a first embodiment will be described.

1.1 Configuration of Semiconductor Memory Device

Figure 2:
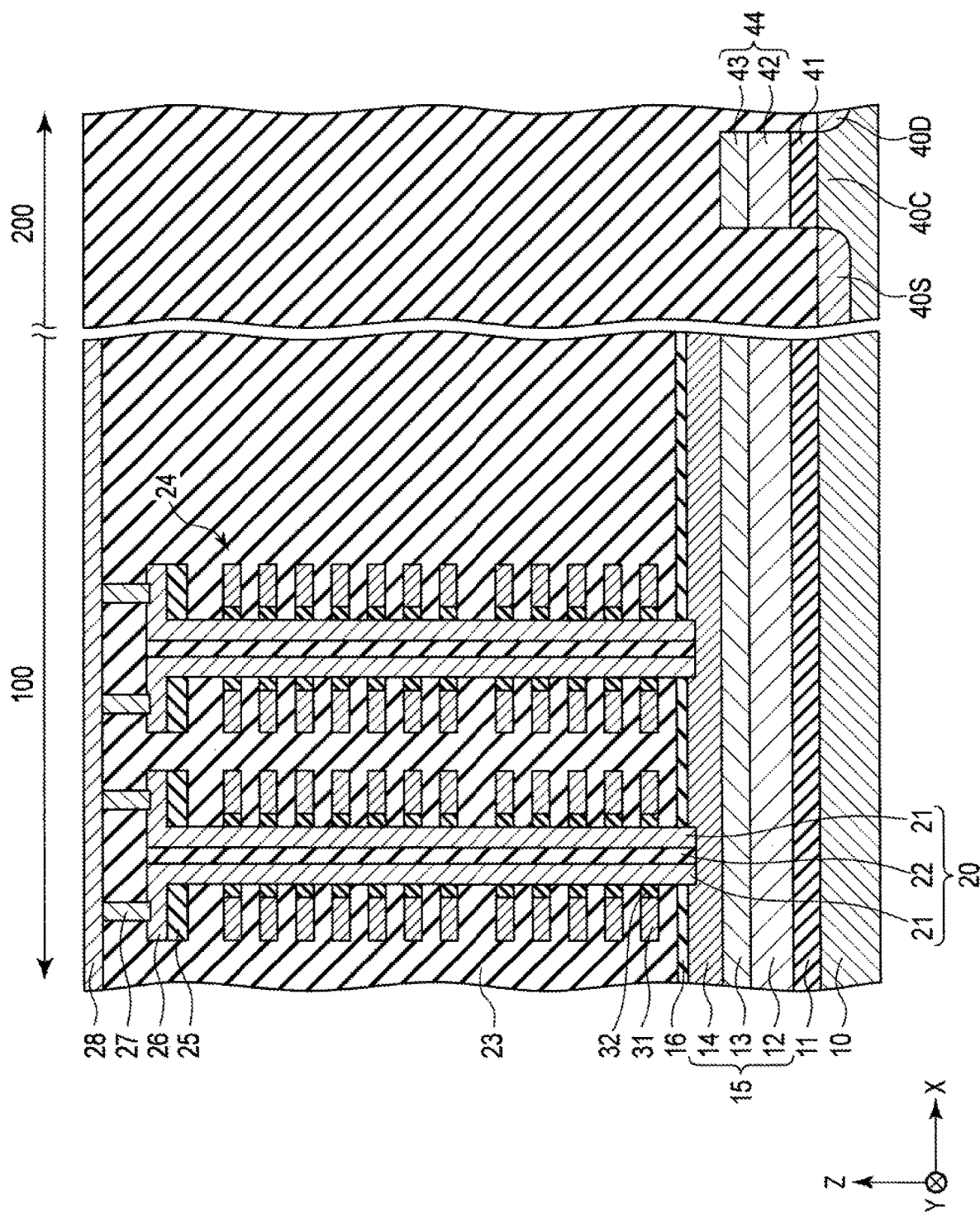
FIG. 2 is a cross-sectional diagram of the semiconductor memory device shown in FIG. 1.

The configuration of the semiconductor memory device according to the first embodiment will be described with reference to FIGS. 1 and 2. FIG. 1 is a perspective diagram showing the configuration of the semiconductor memory device according to the first embodiment. FIG. 2 is a cross-sectional diagram of the semiconductor memory device shown in FIG. 1. In FIGS. 1 and 2, and subsequent figures, two directions that are orthogonal to each other and are parallel to a semiconductor substrate surface are denoted by an X-direction and a Y-direction; and a direction orthogonal to the X-direction and Y-direction (XY-plane) is denoted by a Z-direction. In FIG. 1, an interlayer insulation layer is omitted.

As shown in FIGS. 1 and 2, a semiconductor memory device 1 includes a memory cell array region 100 and a peripheral circuit region 200.

In the memory cell array region 100, an insulation layer 11 and conductive layers 12, 13, and 14 are stacked in sequence on or above a semiconductor substrate, e.g., a silicon substrate 10. The insulation layer 11 includes, for example, a silicon oxide layer. The conductive layer 12 includes, for example, a polycrystalline silicon layer. The conductive layer 13 includes, for example, a tungsten (W) layer. Furthermore, the conductive layer 14 includes, for example, a polycrystalline silicon layer. The conductive layers 12, 13, and 14 constitute a cell source line 15. An insulation layer 16 is provided on the cell source line 15. The insulation layer 16 includes, for example, a silicon oxide layer.

A plurality of pillars 20 extending in the Z-direction are provided on the cell source line 15. As seen from the x-direction, the pillars 20 are arranged in the form of a matrix along the X-direction and the Y-direction. The plurality of pillars 20 are commonly coupled to a single cell source line 15. The pillars 20 are electrically coupled, at the bottom ends, penetrating through the insulation layer 16, to the cell source line 15.

The pillar 20 includes two pieces of channel silicon 21 and an insulation layer 22 provided between the two pieces of channel silicon 21. The channel silicon 21 includes, for example, a polycrystalline silicon layer. The insulation layer 22 includes, for example, a silicon oxide layer.

A plurality of conductive layers 31 extending in the Y-direction are arranged in the X-direction of side surfaces of the channel silicon 21 so as to be isolated from each other in the Z-direction. For this reason, none of the conductive layers 31 is disposed between the pillars 20 arranged in the Y-direction.

A storage layer 32 is provided between the channel silicon 21 and the conductive layer 31. The storage layer 32 is composed of a tunnel insulation film, a charge storage film, and a block insulation film. The tunnel insulation film usually has insulation properties; however, when a predetermined voltage is applied thereto from a drive circuit section, the tunnel insulation film becomes a film making a tunnel electric current flow through, and the tunnel insulation film is, for example, a single-layered silicon oxide film or an ONO film in which a silicon oxide layer, a silicon nitride layer, and a silicon oxide layer are stacked in this order. The charge storage film is a film capable of storing a charge, and is made of, for example, an insulation material including electron-trapping sites. The charge storage film is made of, for example, silicon nitride (SiN) or a polycrystalline silicon film. A block insulation film is provided around the charge storage film. The block insulation film is a film through which substantially no electric current is made to flow, even if a voltage is applied thereto from the drive circuit section. The block insulation film is, for example, a single-layered silicon oxide film or a stacked film composed of a silicon oxide layer and an aluminum oxide layer.

In the present embodiment, the storage layer 32 is provided only between the channel silicon 21 and the conductive layer 31; however, the storage layer may extend in the Z-direction, similarly to the channel silicon 21. The conductive layer 31 includes, for example, a tungsten layer. The conductive layer 31 functions as a word line.

Furthermore, an interlayer insulation film 23 is provided between the conductive layers 31, below the lowermost layer of the conductive layers 31, and above the uppermost layer of the conductive layers 31. The interlayer insulation film 23 includes, for example, a silicon oxide film. A hard mask 25 is provided on a stack 24 that includes the plurality of conductive layers 31 and the interlayer insulation film 23.

The channel silicon 21 is drawn up to the upper portion of the hard mask 25 and is integrated into one body with an interconnect 26 that extends in the X-direction. With this configuration, the channel silicon 21 arranged along the X-direction is coupled to a common interconnect 26. Vias 27 are provided on the interconnect 26. An interconnect 28 extending in the X-direction is provided on the vias 27. The interconnect 28 is coupled to the interconnect 26 through the vias 27. In this way, each of the channel silicon 21 is electrically coupled between the interconnect 28 and the cell source line 15. That is, the semiconductor memory device 1 is an I-pillar type stacked memory device.

The ends of the stack 24 in the Y-direction are processed in tiers. At the ends, a plurality of conductive layers 31 whose positions in the Z-direction are equal to each other are bundled into one. A via 33 is disposed on the end of each of the bundled conductive layers 31. An interconnect 34 is provided on each of the vias 33. The positions of the interconnects 34 in the Z-direction are equal to the positions of the interconnects 28. The interconnect 34 is coupled to the conductive layer 31 through the via 33.

1.2 Other Configuration Example (First Configuration Example) of Semiconductor Memory Device Another configuration example of the semiconductor memory device according to the first embodiment will be described with reference to FIG. 3. FIG. 3 is a perspective diagram showing another configuration example (first configuration example) of the semiconductor memory device. A semiconductor memory device 2 includes a conductive layer 52 as a word line, a pillar 53 as a bit line, and an interconnect 54. A portion at which the conductive layer 52 and the pillar 53 intersect with one another functions as a memory cell.

As shown in FIG. 3, a cell source layer 51 is provided above a semiconductor substrate, for example, a silicon substrate 50. The cell source layer 51 includes, for example, a polycrystalline silicon layer. A plurality of conductive layers 52 respectively extending in the X-direction and the Y-direction and arranged in the Z-direction are provided on the cell source layer 51. The conductive layer 52 includes, for example, a tungsten layer. The conductive layer 52 functions as a word line WL.

A plurality of pillars 53 respectively extending in the Z-direction are provided to the plurality of conductive layers 52. The pillars 53 are arranged in the form of a matrix in the X-direction and the Y-direction. The pillar 53 includes a semiconductor layer. A memory cell MC is formed at a portion where the conductor layer 52 and the pillar 53 intersect with one another.

A plurality of interconnects 54 respectively extending in the Y-direction and arranged in the X-direction are provided above the conductive layers 52. The upper end of the pillar 53 is coupled to the interconnect 54.

Figure 4:
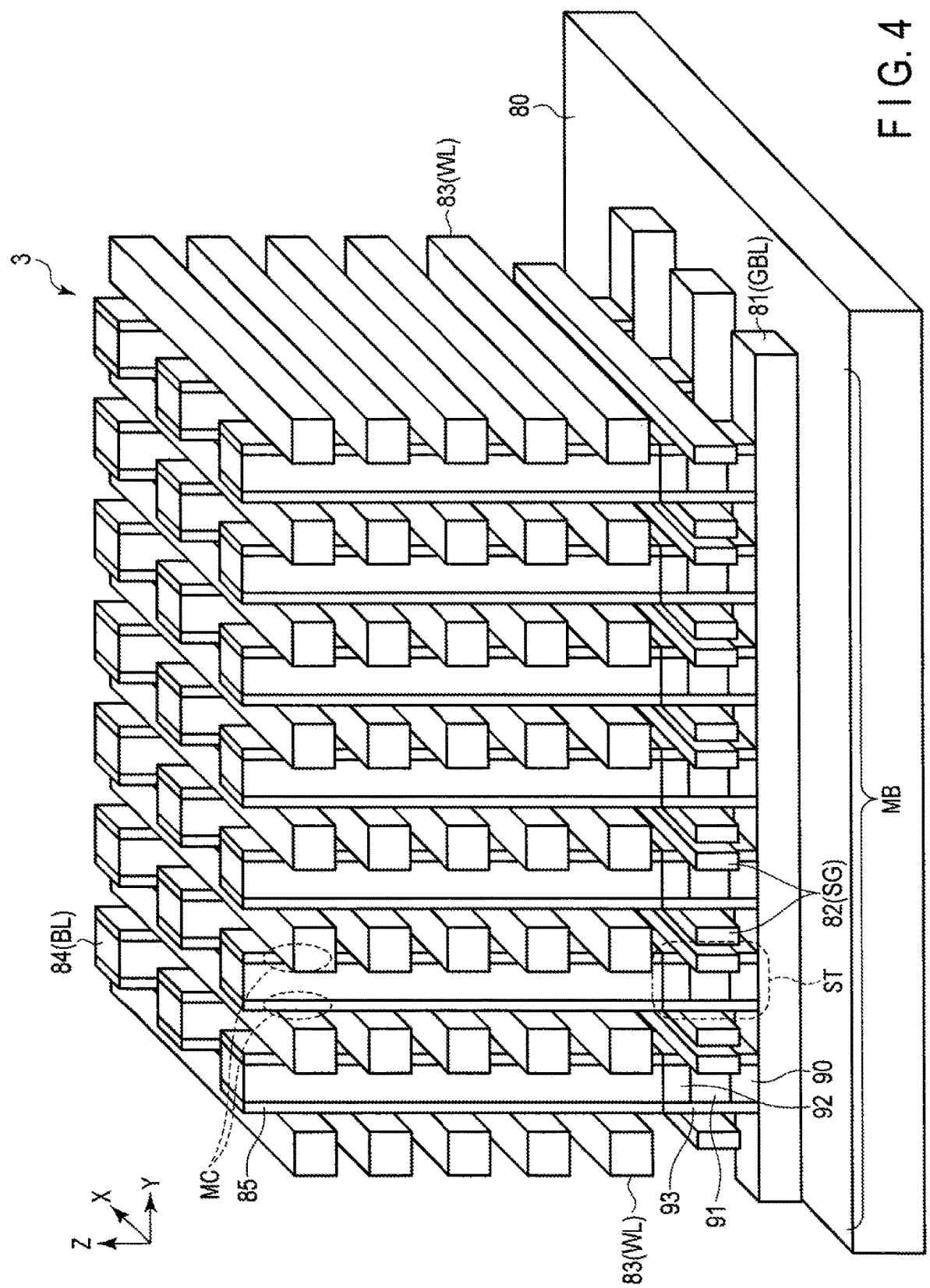
FIG. 4 is a perspective diagram showing a further configuration (second configuration) of the semiconductor memory device according to the first embodiment.

1.3 Other Configuration Example (Second Configuration Example) of Semiconductor Memory Device A further configuration example of the semiconductor device according to the first embodiment will be described with reference to FIG. 4. FIG. 4 is a perspective diagram showing a further configuration (second configuration example) of the semiconductor memory device. A memory cell array of a semiconductor memory device 3 includes a plurality of memory blocks MB. Each of the plurality of memory blocks MB includes a plurality of memory cells. The memory cells store data in a nonvolatile manner.

As shown in FIG. 4, an unillustrated peripheral circuit including a CMOS circuit, etc., is provided on a semiconductor substrate, for example, a silicon substrate 80. The peripheral circuit controls data writing, data reading, and data erasing with respect to the memory cells. Furthermore, a plurality of conductive layers 81 respectively extending in the Y-direction and arranged along the X-direction are provided above the silicon substrate 80. The conductive layers 81 function as global bit lines GEL.

A plurality of conductive layers 82 respectively extending in the X-direction and arranged along the Y-direction are provided above the plurality of conductive layers 81. The conductive layer 82 functions as a select gate line SG. A plurality of conductive layers 83 extending in the X-direction and arranged along the Y-direction are provided above the plurality of conductive layers 82. The conductive layer 83 functions as a word line WL. The plurality of conductive layers 83 are further stacked in plural layers along the Z-direction. A plurality of insulation layers are provided respectively between the stacked conductive layers 83.

A plurality of conductive layers 84 respectively extending in the Z-direction are provided between the conductive layers 83 that are adjacent to each other in the Y-direction. The conductive layer 84 functions as a bit line BL. The conductive layers 84 are arranged along the X-direction, and a plurality of insulation layers are provided respectively between the conductive layers 84 that are adjacent to each other in the X-direction. The conductive layer 84 is coupled to the conductive layer 81 via a select transistor ST.

A resistance change layer 85 is provided between the conductive layer 83 (word line WL) and the conductive layer 84 (bit line BL). The resistance change layer 85 functions as a memory cell MC storing data, at an intersection portion between the conductive layer 83 and the conductive layer 84.

A select transistor ST is provided on the conductive layer 81. The select transistor ST includes a source region 90, a channel region 91, a drain region 92, a gate insulation film 93, and a conductive layer 82 (select gate line SG). The conductive layer 82 functions as a gate electrode of the select transistor ST.

The select transistor ST functions as a switching element. The select transistor ST is composed of a vertical field effect transistor (FET) such as a vertical thin film transistor (TFT). The select transistor ST may be an element in another form, as long as it serves as a switching element.

Figure 5:
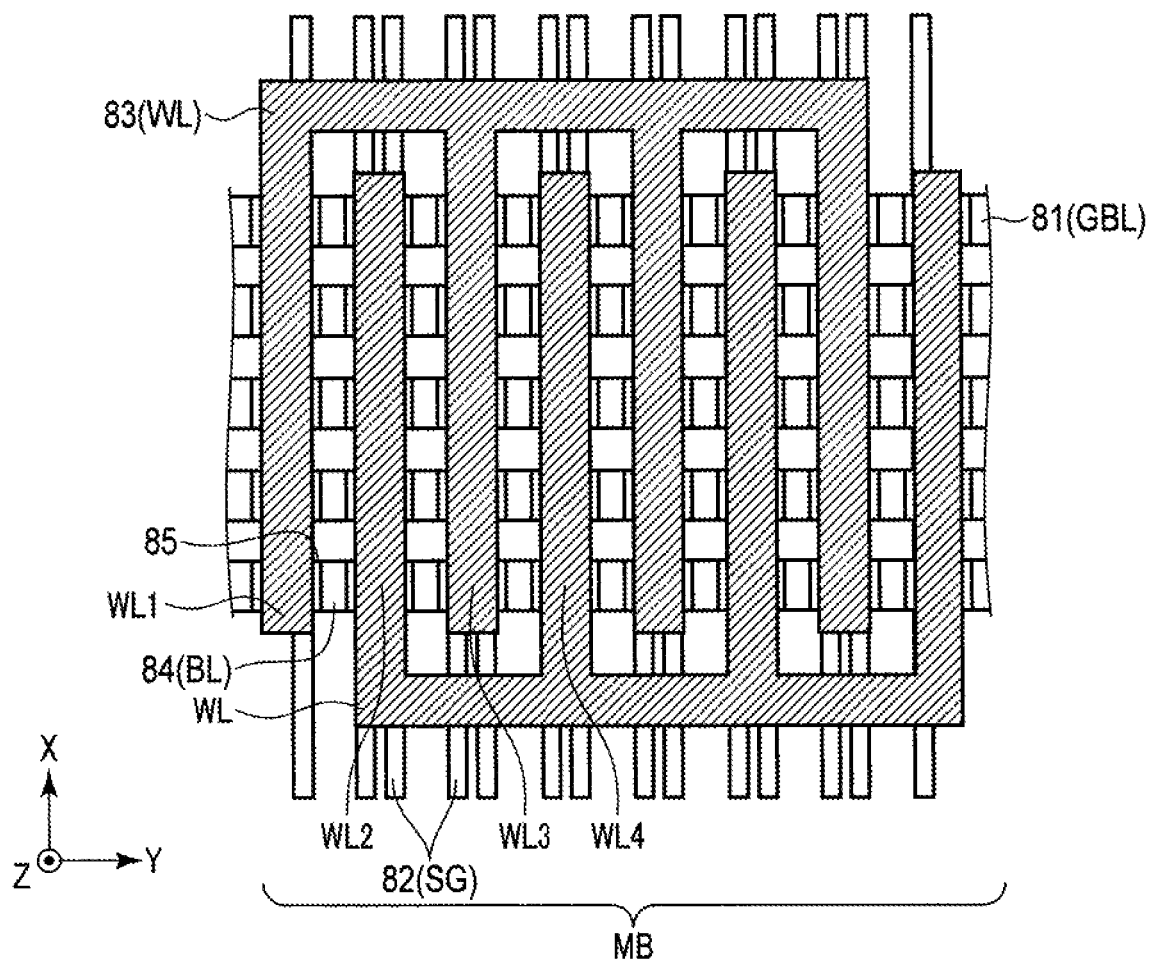
FIG. 5 is a top view of a memory block of the semiconductor memory device shown in FIG. 4.

FIG. 5 shows a top view of a memory block MB. In FIG. 5, the regions shown with hatching illustrate a layout of the conductive layers 83 (word lines WL).

As shown in FIG. 5, a plurality of word lines WL included in the interconnect layers on the same level include, by way of example, a first word line WL1, a second word line WL2, a third word line WL3, and a fourth word line WL4, each of which extends in the X-direction. The first word line WL1 and the second word line WL2 are adjacent to one another in the Y-direction. The second word line WL2 and the third word line WL3 are adjacent to one another in the Y-direction. The third word line WL3 and the fourth word line WL4 are adjacent to one another in the Y-direction. The first word line WL1 and the third word line WL3 are electrically coupled, and the second word line WL2 and the fourth word line WL4 are electrically coupled. That is, a memory cell has two word lines WL each having a comb-shaped structure, and a plurality of word line portions (liner portions of the comb-shaped structure) extending in the X-direction alternately belong to two comb-shaped structures. As another configuration example, a structure in which the first word line WL1 and the fourth word line WL4 are electrically coupled, and the second word line WL2 and the third word line WL3 are electrically coupled could also be implemented, although this example is not illustrated.

Although eight word lines, five global bit lines GBL, and 45 bit lines BL are shown in FIG. 5, this configuration is merely given as an example, and the number of these lines can be suitably selected.

For the conductive layers 84 (bit lines BL) and the conductive layers 82 (select gate lines SG), for example, polycrystalline silicon is used. For the conductive layers 83 (word lines WL) and conductive layers 81 (global bit lines GBL), for example, a low-resistance semiconductor into which high-concentration impurities have been doped, or a metal material is used. For the gate insulation film 93, for example, silicon oxide ($SiO_2$), or silicon nitride (SiN), etc. is used. The resistance change layer 85 is a chalcogenide containing, for example, germanium (Ge), antimony (Sb), and tellurium (Te).

The resistance change layer 85 includes, for example, a $Ge_2Sb_2Te_5$ alloy. The resistance change layer 85 may be a layer in which a barrier layer having nonlinear conductivity and a high-electric conductivity layer composed of a conductive metal oxide are stacked. In the present embodiment, the resistance change layer 85 is described on the assumption that the resistance change layer 85 is composed of a barrier layer and a high-electric conductivity layer. The barrier layer is formed of a material having a comparatively wide bandgap and a low conductivity, and is formed, for example, of amorphous silicon (aSi), silicon nitride (SiN), aluminum oxide (AlO), silicon oxide (SiO), hafnium oxide (HfO), zirconium oxide (ZrO), or a silicate or an aluminate thereof. The barrier layer may be a stacked film in which two or more layers composed of these materials are stacked. On the other hand, the high-electric conductivity layer is formed of a material having a relatively narrow bandgap and a high conductivity, such as titanium oxide (TiO), tungsten oxide (WO), or niobium oxide (NbO), etc. That is, the bandgap of the high-electric conductivity layer is narrower than that of the barrier layer, and the conductivity of the high-electric conductivity layer is higher than that of the barrier layer. By applying a voltage to the resistance change layer 85, oxygen ions are introduced from the barrier layer into the high-electric conductivity layer, and the band structure of the resistance change layer is changed, resulting in a change in the resistance state.

With the configuration described above, memory cells MC each including word lines WL, bit lines BL, and the resistance change layer 85 provided between a word line WL and a bit line BL are arranged in the form of a three-dimensional matrix. In this structure, word lines WL and bit lines BL simply form a line-and-space pattern. It is sufficient that a word line WL and a bit line BL have a positional relationship where they intersect with one another, and there is no need to consider misalignment thereof in the word line direction and the bit line direction. Therefore, the need for the alignment accuracy thereof in a memory cell when manufactured is considerably relaxed, making it possible to manufacture a semiconductor memory device with ease.

1.4 Configuration of Memory Cell MC

Next, the configuration of a memory cell in the semiconductor memory device according to the first embodiment will be described with reference to FIG. 6. Herein, a memory cell MC possessed by the semiconductor memory device 2 shown in FIG. 3 is cited as an example.

Figure 6:
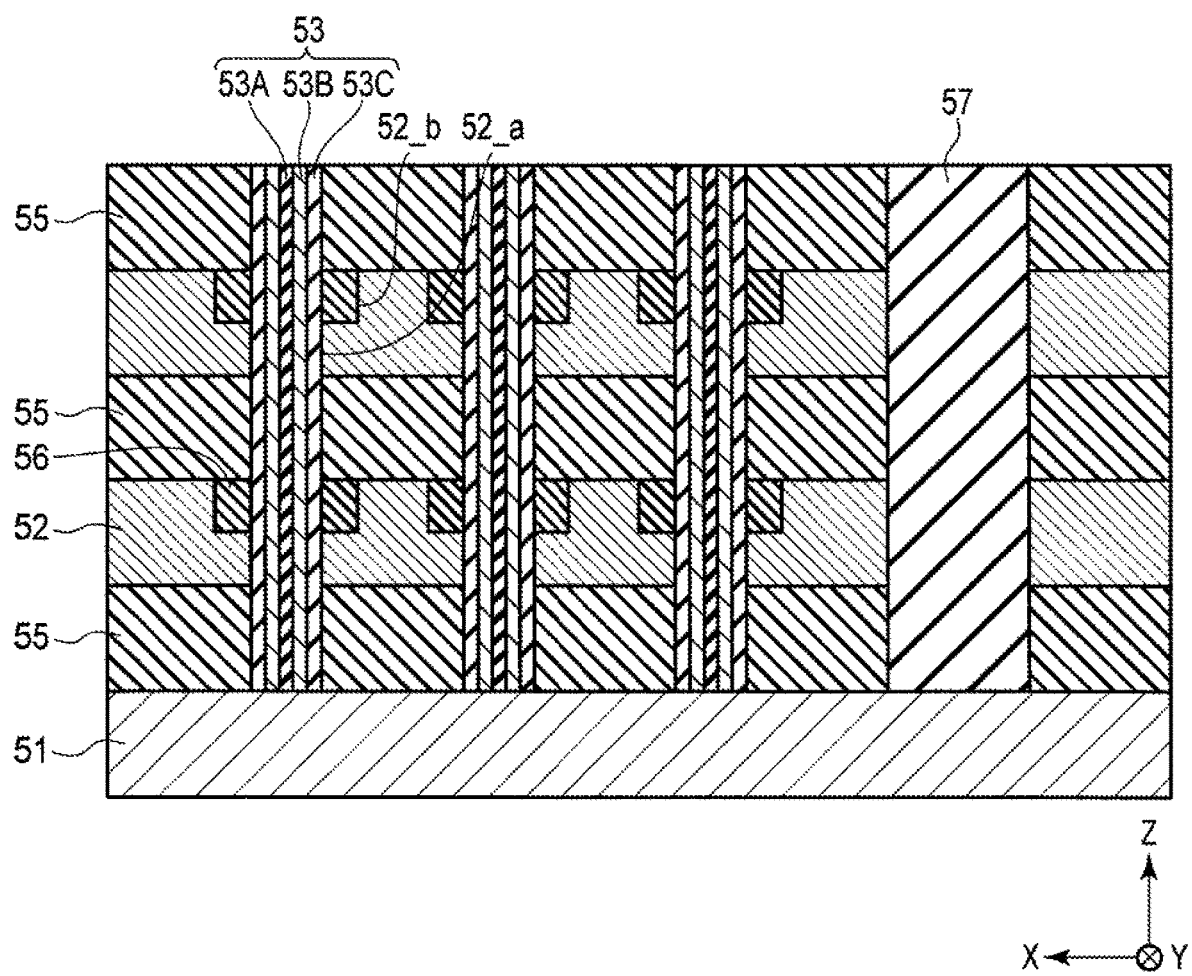
FIG. 6 is a schematic diagram showing the configuration of a memory cell in the first embodiment.

FIG. 6 is a schematic diagram showing the configuration of a memory cell MC possessed by the semiconductor memory device according to the first embodiment. A cell source layer 51 is provided above a silicon substrate 50. The cell source layer 51 includes, for example, a polycrystalline silicon layer. An insulation layer 55 is provided on the cell source layer 51. The insulation layer 55 includes, for example, a silicon oxide layer.

A plurality of pillars 53 extending in the Z-direction are provided in a structure including the stacked insulation layers 55 and conductive layers 52. The pillar 53 includes a core insulation layer 53A, a semiconductor layer 53B, and a storage layer 53C. The core insulation layer 53A is composed, for example, of silicon oxide ($SiO_2$). The semiconductor layer 53B is composed, for example, of polycrystalline silicon. The storage layer 53C includes a block insulation film, a charge storage film, and a tunnel insulation film. The tunnel insulation film is, for example, a single-layered silicon oxide film or an ONO film in which a silicon oxide layer, a silicon nitride layer, and a silicon oxide layer are stacked in this order. The charge storage film is composed, for example, of silicon nitride (SiN) or a polycrystalline silicon film. The block insulation film is provided around the charge storage film. The block insulation film is, for example, a single-layered silicon oxide film or a stacked film composed, for example, of a silicon oxide layer and an aluminum oxide layer. The conductive layer 52 includes, for example, a tungsten layer.

The conductive layer 52 has a first surface 52_a and a second surface 52_b, facing the pillar 53. The first surface 52_a contacts with the storage layer 53C. Specifically, the first surface 52_a contacts with the block insulation film of the storage layer 53C. The second surface 52_b faces the pillar 53 via an insulation layer 56. The insulation layer 56 is provided between the second surface 52_b and the pillar 53. The second surface 52_b and the insulation layer 56 contact with each other.

The same structure is provided between a different pillar 53 adjacent to the pillar 53 and the conductive layer 52. That is, the conductive layer 52 has a first surface 52_a and a second surface 52_b that are facing the pillar 53. The first surface 52_a contacts with the storage layer 53C. The second surface 52_b faces the pillar 53 via the insulation layer 56.

Furthermore, an insulation layer 57 extending in the Z-direction and the Y-direction is provided in the structure including the stacked insulation layers 55 and conductive layers 52. The insulation layer 57 isolates the conductive layer 52. The insulation layer 57 includes, for example, a silicon oxide layer.

Next, the configuration of a memory cell in the semiconductor memory device according to the first embodiment will be described with reference to FIG. 7. Herein, a memory cell MC possessed by the semiconductor memory device 1 shown in FIGS. 1 and 2 is cited as an example.

Figure 7:
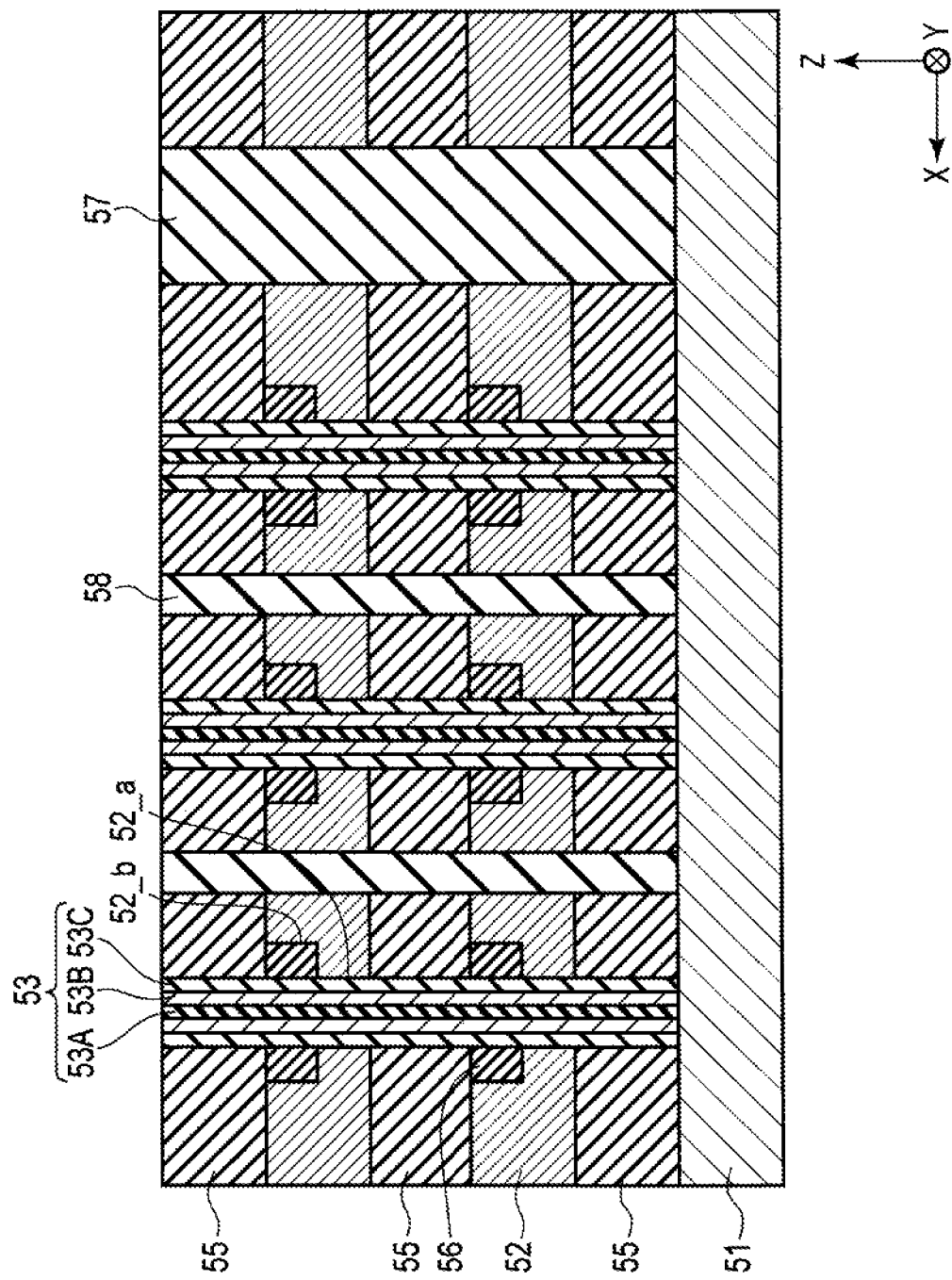
FIG. 7 is a schematic diagram showing another configuration of the memory cell in the first embodiment.

FIG. 7 is a schematic diagram showing another configuration of a memory cell. A point that FIG. 7 differs from FIG. 6 is that an insulation layer 58 is provided between conductive layers 52. The descriptions on the same configurations as those shown in FIG. 6 are omitted.

An insulation layer 55 extending in the Y-direction and the conductive layer 52 extending in the Y-direction are alternately stacked in the Z-direction. In the stack, pillars 53 extending in the Z-direction are arranged in the X-direction and the Y-direction. A pillar 53 is provided between conductive layers 52 that are adjacent to each other in the X-direction. The conductive layer 52 is provided between two pillars 53 that are adjacent to each other in the X-direction, and the conductive layer 52 is isolated by the insulation layer 58. That is, the conductive layers 52 arranged in the X-direction are not respectively electrically coupled, unlike the structure shown in FIG. 3.

Figure 8:
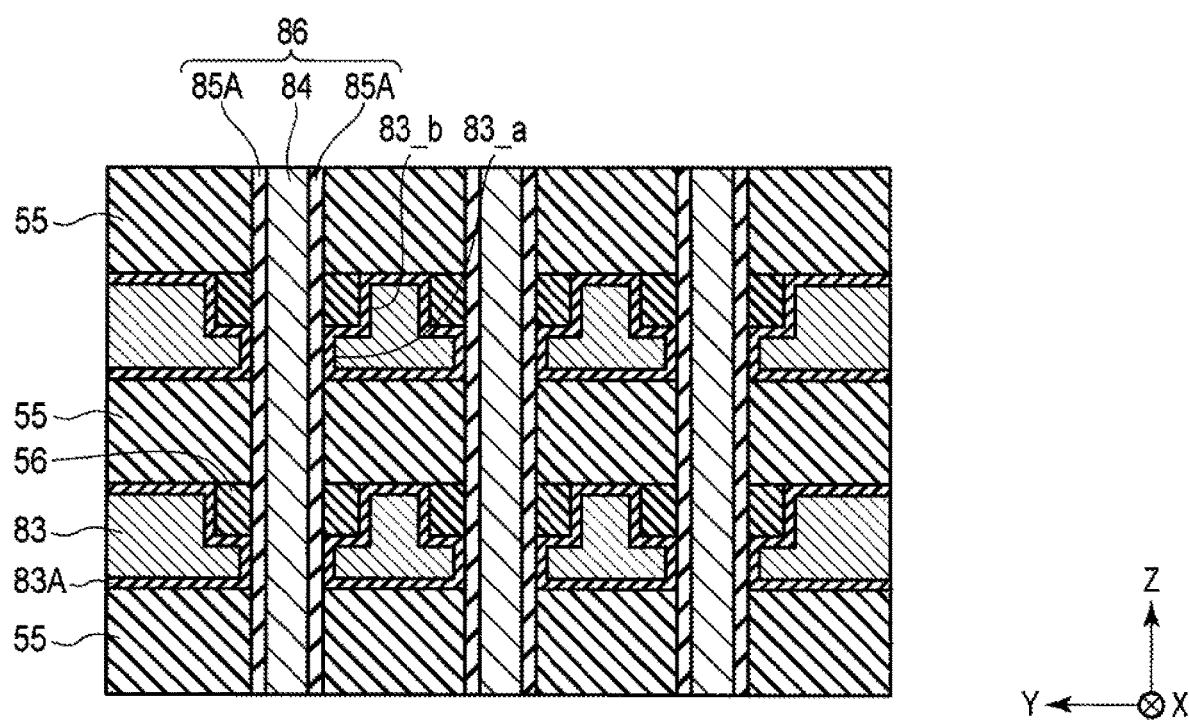
FIG. 8 is a schematic diagram showing another configuration of the memory cell in the first embodiment.

Next, the configuration of the memory cell in the semiconductor memory device according to the first embodiment will be described with reference to FIG. 8. Herein, a memory cell MC of the semiconductor memory device 3 shown in FIG. 4 is cited as an example. FIG. 8 differs from FIG. 6 mainly in that a pillar 86 includes a conductive layer 84 and a barrier layer 85A. Explanations on the other configurations are omitted.

By way of example of a resistance change layer according to the present embodiment, the resistance change layer is composed of two layers of a barrier layer 85A and a high-electric conductivity layer 83A. The resistance change layer in the present embodiment includes portions where the barrier layer 85A and the high-electric conductivity layer 83A contact with each other. Materials of the layers are the same as those described above, and explanations thereof are omitted.

The conductive layer 83 has a first surface 83_a and a second surface 83_b that is located away from the conductive layer 83 in the Y-direction. The first surface 83_a contacts with the resistance change layer. In the present embodiment, the first surface 83_a contacts with the high-electric conductivity layer 83A. The insulation layer 56 is provided between the second surface 83_b and the conductive layer 84. Alternatively, when the high-electric conductivity layer 83A is provided between the conductive layer 83 and the insulation layer 55 and covers the conductive layer 83, the insulation layer 56 is provided between high-electric conductivity layer 83A and a barrier layer 85A. When the resistance change layer is composed of the other materials and is disposed along the conductive layer 84 in the Z-direction, the insulation layer 56 is provided between the second surface 83_b and the resistance change layer.

1.5 Manufacturing Method of Semiconductor Memory Device

Next, a manufacturing method of the semiconductor memory device according to the first embodiment will be described with reference to FIGS. 9 to 15. FIGS. 9 to 15 are cross-sectional diagrams showing the manufacturing method of the semiconductor memory device.

Figure 9:
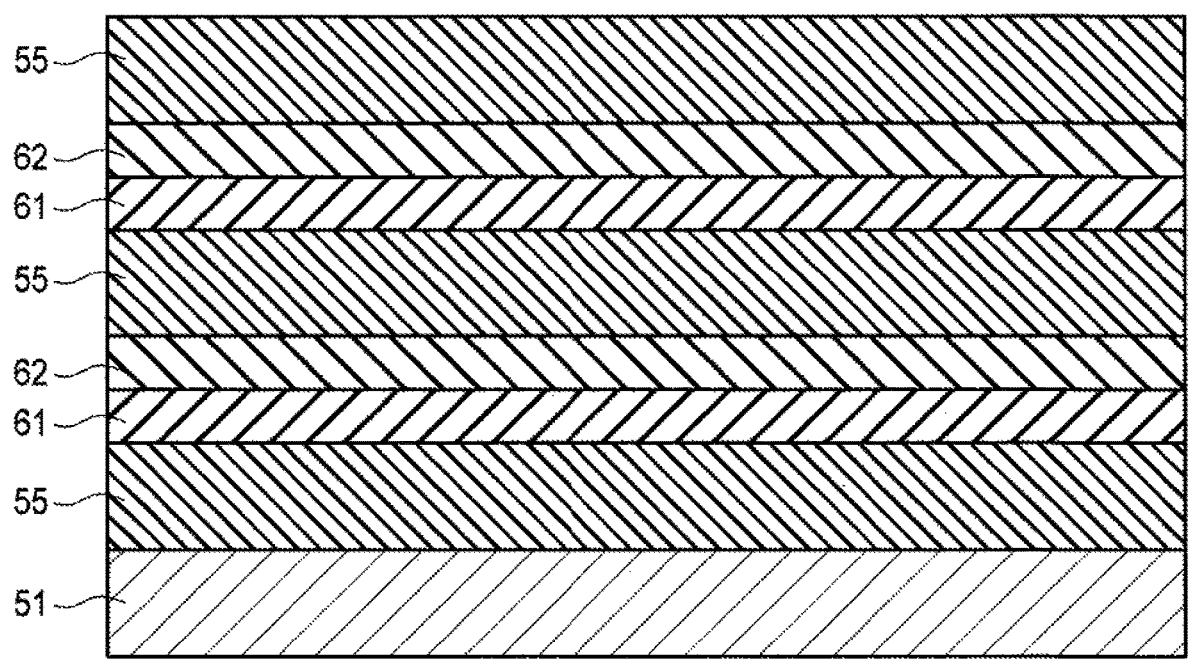

First, as shown in FIG. 9, an insulation layer 55 is formed on a cell source layer 51 provided above a silicon substrate 50 by, for example, a chemical vapor deposition (CVD) method (or an atomic layer deposition (ALD) method). Subsequently, a sacrifice layer 61 is formed on the insulation layer 55 by, for example, a CVD method (or an ALD method). Furthermore, a sacrifice layer 62 is formed on the sacrifice layer 61. The sacrifice layer 61 and the sacrifice layer 62 include, for example, a silicon nitride layer. The sacrifice layer 61 is a low-etching rate layer having a low-etching rate as compared to the sacrifice layer 62. The sacrifice layer 62 is a high-etching rate layer having a high-etching rate as compared to the sacrifice layer 61. The sacrifice layer 61 and the sacrifice layer 62 can be formed by suitably changing, for example, a source gas or a film-formation temperature in the CVD method (or ALD method). Subsequently, the formation of the insulation layer 55, the sacrifice layer 61, and the sacrifice layer 62 is repeated by only the necessary number of conductive layers 52.

Figure 10:
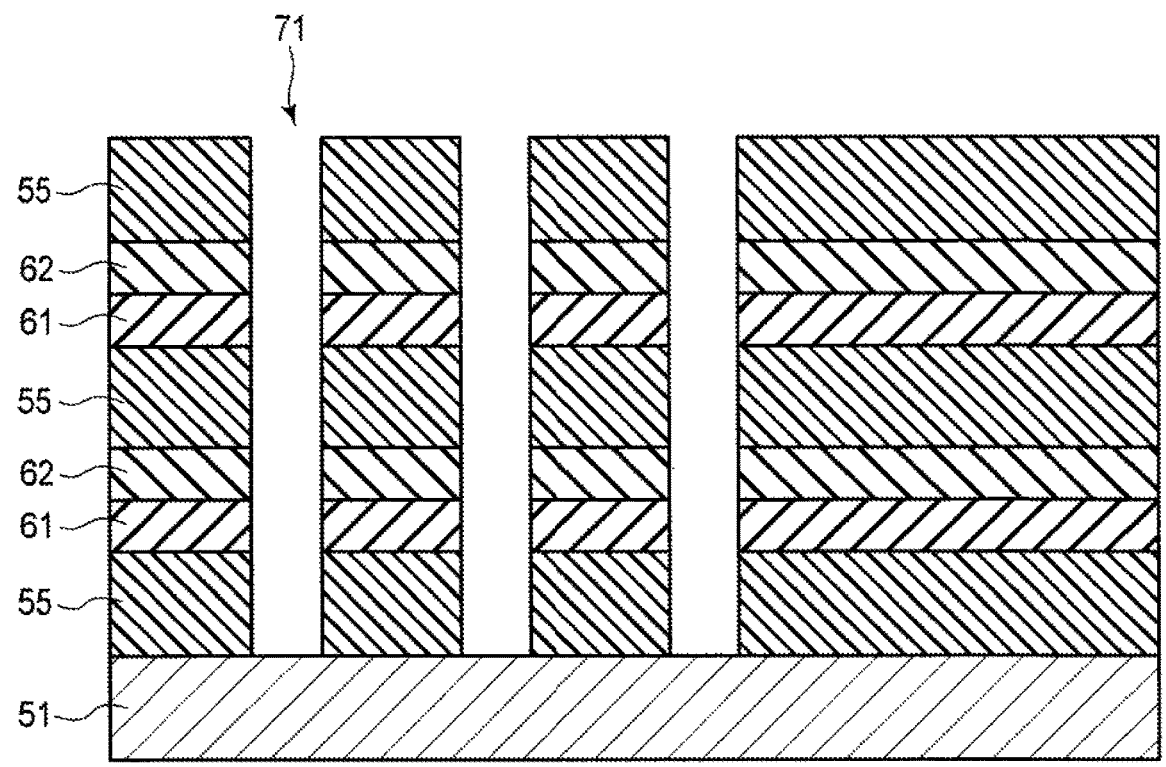

Next, as shown in FIG. 10, a hole 71 is bored in a stack including the insulation layer 55, the sacrifice layer 61, and the sacrifice layer 62 by, for example, a reactive ion etching (RIE) method. The hole 71 is provided to form a pillar 53 including a core insulation layer 53A, a semiconductor layer 53B, and a storage layer 53C.

Figure 11:
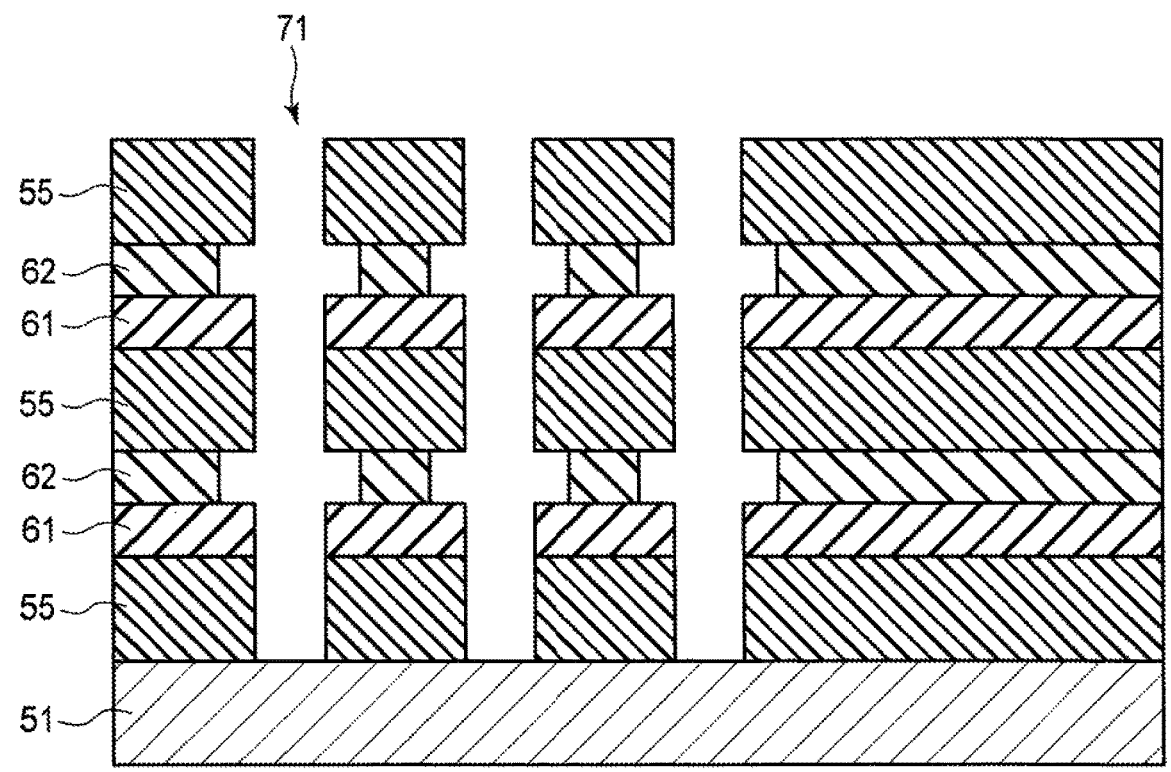

Next, as shown in FIG. 11, the sacrifice layer 62 having a high-etching rate is etched back via the hole 71 by wet-etching using, for example, a phosphoric acid solution. With this, the sacrifice layer 62 is set back from the side wall of the hole 71.

Next, as shown in FIG. 12, an insulation layer 56 is formed on the side wall of the hole 71 by, for example, a CVD (or an ALD) method. With this, the insulation layer 56 is formed on the side wall of the hole 71 and in the regions of the side wall where the sacrifice layer 62 is set back. The insulation layer 56 includes, for example, silicon oxide layer.

Next, as shown in FIG. 13, the insulation layer 56 present on the side wall of the hole 71 is removed by, for example, an RIE method. At that time, the insulation layer 56 present in the regions of the side wall where the sacrifice layer 62 is set back is left without being removed.

Next, as shown in FIG. 14, a storage layer 53C is formed on the side wall of the hole 71 by, for example, a CVD (or an ALD) method. A semiconductor layer 53B is further formed on the side wall of the storage layer 53C in the hole 71. Furthermore, a core insulation layer 53A is formed on the side wall of the semiconductor layer 53B in the hole 71.

Next, as shown in FIG. 15, a slit trench 72 is bored in the stack including the insulation layer 55, the sacrifice layer 61, and the sacrifice layer 62, by, for example, an RIE method. Subsequently, the sacrifice layer 61 having a low-etching rate and the sacrifice layer 62 having a high-etching rate are removed together via the trench 72, by wet-etching using, for example, a phosphoric acid solution. With this, a hollow 73 is formed between the insulation layers 55.

Next, as shown in FIG. 6, a conductive layer 52 is formed in the hollow 73 by, for example, a CVD (or an ALD) method. Subsequently, an insulation layer 57 is formed in the slit trench 72.

After that, necessary insulation layers, contact plugs, and interconnects, etc., are formed, and then the manufacture of a semiconductor memory device is finished.

1.6 Effect of First Embodiment

The semiconductor memory device according to the first embodiment includes a first conductive layer as a word line, a second conductive layer as a bit line extending in the Z-direction intersecting with the first conductive layer, and a resistance change layer (or a storage layer) provided at an intersection portion between the first conductive layer and the second conductive layer. The first conductive layer has a first surface facing the second conductive layer via the resistance change layer, and a second surface facing the second conductive layer via an insulation layer.

In other words, the first conductive layer as a word line has a first portion contacting with the second conductive layer as a bit line via a resistance change layer (or a storage layer), and a second portion that does not contact with the second conductive layer. In the Z-direction, the thickness of the first portion is less than the thickness of the second portion.

In the first embodiment, by being provided with the configuration described above, it is possible to change an area (hereinafter, referred to as a cell area) in which a word line and a bit line contact with each other via a resistance change layer, regardless of the thickness of the word line. With this configuration, the cell area can be reduced with respect to the thickness of the word line. As a result, the cell area can be adjusted without increasing the wiring resistance of the word line, i.e., without reducing the thickness of the word line. Moreover, by adjusting the cell area, it is possible to adjust (e.g., restrict) a cell electric current (e.g., ON-current) flowing in accordance with the cell area.

Furthermore, in a structure with a reduced cell area, an electric field can be concentrated on a portion where the cell area is reduced, making it possible to improve the efficiency of switching operations. With this, it is possible to reduce the operating voltage to be applied between a word line and a bit line.

2. Second Embodiment

Next, a semiconductor memory device according to a second embodiment will be described. The configuration of the semiconductor memory device according to the second embodiment is the same as that of the first embodiment described above. In the second embodiment, mainly points that are different from the first embodiment will be described.

2.1 Configuration of Memory Cell

Figure 16:
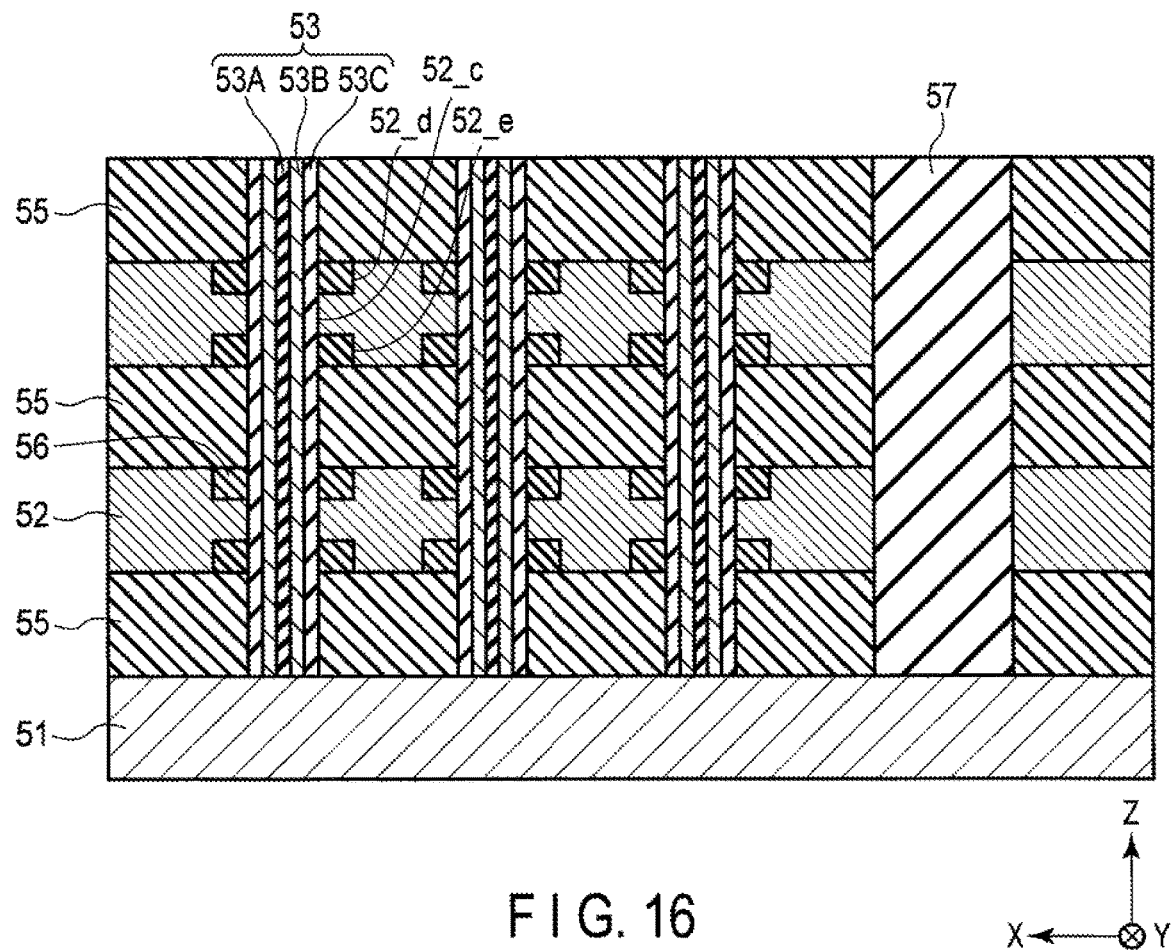
FIG. 16 is a schematic diagram showing the configuration of a memory cell in a second embodiment.

The configuration of a memory cell in the semiconductor memory device according to the second embodiment will be described with reference to FIG. 16. FIG. 16 is a schematic diagram showing the configuration of a memory cell MC of a semiconductor memory device 2.

As shown in FIG. 16, a conductive layer 52 has a first surface 52_c, a second surface 52_d, and a third surface 52_e, facing a pillar 53. The first surface 52_c contacts with a storage layer 53C. Specifically, the first surface 52_c contacts with a block insulation film of the storage layer 53C. The second surface 52_d faces the pillar 53 via an insulation layer 56. The third surface 52_e faces the pillar 53 via the insulation layer 56. The insulation layer 56 is provided between the second surface 52_d and the pillar 53. The second surface 52_d and the insulation layer 56 contact with each other. Similarly, the insulation layer 56 is provided between the second surface 52_e and the pillar 53. The second surface 52_e and the insulation layer 56 are in contact with each other.

2.2 Manufacturing Method of Semiconductor Memory Device

Figure 17:
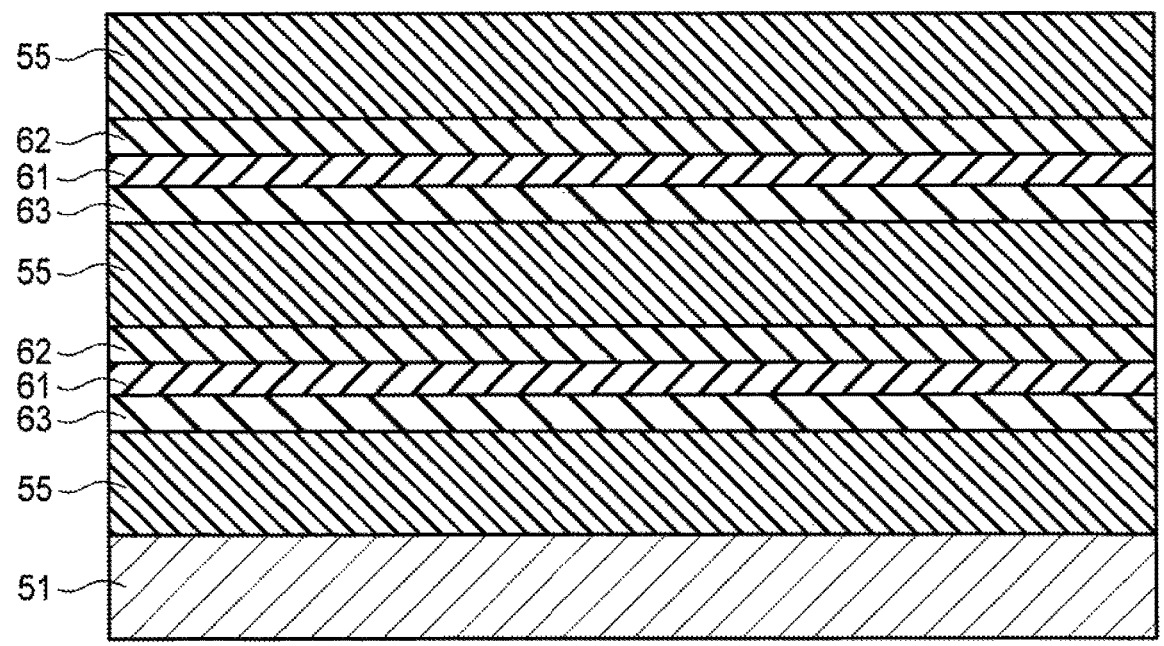
FIG. 17 is a cross-sectional diagram showing a manufacturing method of a semiconductor memory device according to the second embodiment.

A manufacturing method of a semiconductor memory device according to a second embodiment will be described. FIG. 17 is a cross-sectional diagram showing the manufacturing method of a semiconductor memory device.

As shown in FIG. 17, sacrifice layers 63, 61, and 62 are formed in sequence on the insulation layer 55 by, for example, a CVD method (or an ALD method). The sacrifice layers 63, 61, and 62 include, for example, a silicon nitride layer. The sacrifice layer 63 has a high-etching rate as compared to the sacrifice layer 61, and is a layer whose etching rate is substantially the same, as the etching rate of the sacrifice layer 62. The sacrifice layer 61 is a low-etching rate layer having a low-etching rate as compared to the sacrifice layers 63 and 62. The sacrifice layer 62 is a layer having a high-etching rate as compared to the sacrifice layer 61, and is a layer whose etching rate is substantially the same as that of the sacrifice layer 63. Subsequent steps of the manufacturing method are the same as those of the first embodiment described above. Namely, the steps described using FIGS. 10-15, and FIG. 6 are used.

2.3 Effect of Second Embodiment

In the second embodiment, it is possible to change a cell area in which a word line and a bit line contact with each other via a resistance change layer (or a storage layer), regardless of the thickness of the word line. With this configuration, the cell area can be adjusted without changing the thickness of the word line. Moreover, by adjusting the cell area, it is possible to adjust (e.g., restrict) a cell electric current (e.g., ON-current) flowing in accordance with the cell area.

Furthermore, in the second embodiment, the position of the first surface in a word line can be more freely changed than in the first embodiment. The other configurations are the same as those of the first embodiment described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope or spirit of the inventions.

What is claimed is:

1. A semiconductor memory device comprising:
   a substrate;
   a first signal line that extends in a first direction crossing the substrate;
   a first conductive layer that extends in a second direction crossing the first direction and being parallel to the substrate, and has a first surface, a second surface, and a third surface, each of the first surface and the second surface extending in the first direction, the third surface connected between the first and second surfaces and extending in a third direction crossing the first and second directions;

a first storage layer provided between the first signal line and the first conductive layer; and a first insulation layer provided between the second surface and the first storage layer, wherein the third surface is in contact with the first insulation layer.

2. The semiconductor memory device according to claim 1, further comprising a second conductive layer that is adjacent to the first conductive layer in the third direction, extends in the second direction, and has a third surface and a fourth surface that is away from the first signal line in the third direction, wherein the first insulation layer is provided between the first storage layer and the fourth surface, and the first conductive layer is electrically coupled to the second conductive layer.

3. The semiconductor memory device according to claim 2, further comprising:

a second signal line that extends in the first direction; and a second storage layer between the second signal line and the second conductive layer, wherein the second conductive layer has a fifth surface and a sixth surface that is away from the second signal line in the third direction, and a second insulation layer is provided between the sixth surface and the second storage layer.

4. The semiconductor memory device according to claim 1, further comprising:

a second conductive layer that is adjacent to the first conductive layer in the third direction, extends in the second direction, and has a fourth surface and a fifth surface that is away from the first signal line in the third direction;

a second storage layer provided between the first signal line and the second conductive layer; and a second insulation layer provided between the fifth surface and the second storage layer.

5. The semiconductor memory device according to claim 4, further comprising:

a second signal line that extends in the first direction;

a third conductive layer that extends in the second direction, is adjacent to the second conductive layer in the third direction, and has a sixth surface and a seventh surface that is away from the second signal line in the third direction;

a third insulation layer provided between the second conductive layer and the third conductive layer;

a third storage layer provided between the second signal line and the third conductive layer; and a fourth insulation layer provided between the seventh surface and the second signal line.

6. The semiconductor memory device according to claim 5, further comprising:

a fourth conductive layer that is adjacent to the third conductive layer in the third direction, extends in the second direction, and has an eighth surface and a ninth surface that is away from the second signal line in the third direction;

a fourth storage layer provided between the second signal line and the fourth conductive layer; and a fifth insulation layer provided between the ninth surface and the fourth storage layer.

7. The semiconductor memory device according to claim 1, wherein the first surface and the second surface of the first conductive layer face the first storage layer, and the first surface is in contact with the first storage layer.

8. The semiconductor memory device according to claim 1, wherein the first conductive layer has a fourth surface that is away from the first signal line in the third direction, and further comprising a second insulation layer provided between the fourth surface and the first storage layer.

9. The semiconductor memory device according to claim 8, wherein the first surface of the first conductive layer is disposed between the second surface and the fourth surface in the first direction.

10. The semiconductor memory device according to claim 1, wherein the first storage layer includes a block insulation film, a charge storage film, and a tunnel insulation film sequentially arranged from the first conductive layer side.

11. The semiconductor memory device according to claim 10, wherein the tunnel insulation film includes one of a silicon oxide film or a stack in which a silicon oxide film, a silicon nitride film and a silicon oxide film are stacked.

12. The semiconductor memory device according to claim 10, wherein the charge storage film includes a silicon nitride film.

13. The semiconductor memory device according to claim 10, wherein the block insulation film includes a silicon oxide film or a stack of a silicon oxide film and an aluminum oxide film.

14. The semiconductor memory device according to claim 1, wherein the first signal line includes a semiconductor layer.

15. The semiconductor memory device according to claim 1, further comprising:

a second conductive layer being adjacent to the first conductive layer in the first direction, and extending in the second direction; and an interlayer insulation layer provided between the first conductive layer and the second conductive layer, wherein the second portion is in contact with the interlayer insulation layer and the first storage layer.

* * * * *